United States Patent
Wu et al.

(10) Patent No.: US 10,832,978 B2
(45) Date of Patent: Nov. 10, 2020

(54) BOTTOM EMISSION MICROLED DISPLAY AND A REPAIR METHOD THEREOF

(71) Applicant: Prilit Optronics, Inc., Tainan (TW)

(72) Inventors: Biing-Seng Wu, Tainan (TW); Chao-Wen Wu, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 0 days.

(21) Appl. No.: 16/793,942

(22) Filed: Feb. 18, 2020

(65) Prior Publication Data

US 2020/0185284 A1 Jun. 11, 2020

Related U.S. Application Data

(60) Continuation of application No. 16/405,891, filed on May 7, 2019, now Pat. No. 10,636,710, which is a division of application No. 15/963,477, filed on Apr. 26, 2018, now abandoned.

(30) Foreign Application Priority Data

May 3, 2017 (TW) .............................. 106114691 A

(51) Int. Cl.
| | |
|---|---|
| *H01L 21/66* | (2006.01) |
| *H01L 25/075* | (2006.01) |
| *H01L 33/00* | (2010.01) |
| *H01L 33/60* | (2010.01) |
| *H01L 33/62* | (2010.01) |

(52) U.S. Cl.
CPC .......... *H01L 22/22* (2013.01); *H01L 25/0753* (2013.01); *H01L 33/0095* (2013.01); *H01L 33/60* (2013.01); *H01L 33/62* (2013.01); *H01L 2933/0058* (2013.01); *H01L 2933/0066* (2013.01)

(58) Field of Classification Search
CPC . H01L 51/50–56; H01L 51/0032–0095; H01L 27/32–3297; H01L 2251/50–568; H01L 22/22; H01L 33/66; H01L 25/0753; B32B 2457/206
See application file for complete search history.

(56) References Cited

U.S. PATENT DOCUMENTS

| | | | |
|---|---|---|---|
| 2007/0200492 A1* | 8/2007 | Cok | H01L 51/5284 313/506 |
| 2014/0159064 A1* | 6/2014 | Sakariya | H01L 33/44 257/88 |

* cited by examiner

*Primary Examiner* — Dale E Page
*Assistant Examiner* — Wilner Jean Baptiste
(74) *Attorney, Agent, or Firm* — Donald E. Stout; Stout, Uxa & Buyan, LLP

(57) ABSTRACT

A bottom emission microLED display includes a microLED disposed above a transparent substrate; a light guiding layer surrounding the microLED to controllably guide light generated by the microLED towards the transparent substrate; and a reflecting layer formed over the light guiding layer to reflect the light generated by the microLED downwards and to confine the light generated by the microLED to prevent the light from leaking upwards or sidewards.

7 Claims, 20 Drawing Sheets

BOTTOM EMISSION MICROLED DISPLAY AND A REPAIR METHOD THEREOF

CROSS-REFERENCE TO RELATED APPLICATIONS

This application is a continuation application of U.S. application Ser. No. 16/405,891, filed on May 7, 2019, and now allowed, which in turn is a divisional application of U.S. application Ser. No. 15/963,477, filed on Apr. 26, 2018, now abandoned, which in turn claims priority to Taiwan Patent Application No. 106114691, filed on May 3, 2017. The entire contents of each of the foregoing applications are herein expressly incorporated by reference.

BACKGROUND OF THE INVENTION

1. Field of the Invention

The present invention generally relates to a micro light-emitting diode (microLED), and more particularly to a bottom emission microLED display and a repair method thereof.

2. Description of Related Art

A micro light-emitting diode (microLED, mLED or μLED) display panel is one of flat display panels, and is composed of microscopic microLEDs each having a size of 1-10 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

During manufacturing a microLED display panel, individual microLEDs should be picked up and transferred to a display panel by electrostatic force, magnetic force or vacuum suction force. In practice, while performing picking, transferring and bonding, some individual microLEDs may be picked up and released abnormally, or the microLEDs are defective. After the microLEDs are bonded with a substrate of the display panel, it is difficult to repair those microLEDs that are defective or cannot be operated normally. A destructive scheme is usually adopted to perform the repairing, which is complicated and time-consuming.

A need has thus arisen to propose a simple and fast scheme to repair a microLED display panel.

SUMMARY OF THE INVENTION

In view of the foregoing, it is an object of the embodiment of the present invention to provide a bottom emission microLED display and a repair method thereof. The repair method of the microLED display can repair the microLED display fast and conveniently without using destructive scheme.

According to one embodiment, a bottom emission micro light-emitting diode (microLED) display includes a transparent substrate, a microLED, a light guiding layer and a reflecting layer. The microLED is disposed above the transparent substrate. The light guiding layer surrounds the microLED to controllably guide light generated by the microLED towards the transparent substrate. The reflecting layer is formed over the light guiding layer to reflect the light generated by the microLED downwards and to confine the light generated by the microLED to prevent the light from leaking upwards or sidewards.

According to a repair method of a bottom emission micro light-emitting diode (microLED) display of one embodiment, a transparent substrate is provided with an original area and a repair area. A first conductive layer is formed to result in a selection electrode and an extended electrode extended from the selection electrode towards the repair area. A vertical-type original microLED is disposed above the selection electrode, which bonds and electrically connects with a first electrode of the microLED. A first light guiding layer is entirely formed above the transparent substrate, the selection electrode, the extended electrode and the original microLED. The first light guiding layer is etched to expose a second electrode of the original microLED and the transparent substrate in the repair area. A second conductive layer is formed to result in a common electrode above the first light guiding layer in the original area, thereby electrically connecting with the second electrode of the original microLED, and to result in the second conductive layer above the exposed transparent substrate in the repair area, wherein the extended electrode and the second conductive layer in the repair area partially overlap. When the original microLED passes a functional test, the following steps are performed: forming entirely a second light guiding layer above the common electrode and the first light guiding layer; etching the second light guiding layer to expose the common electrode and forming a top electrode above the second light guiding layer to electrically connect with the common electrode. When the original microLED fails the function test, the following steps are performed: disposing a vertical-type repair microLED on the second conductive layer above the exposed transparent substrate in the repair area, such that a first electrode of the repair microLED bonds and electrically connects with the second conductive layer above the exposed transparent substrate; welding to electrically connect the partially overlapped second conductive layer and the extended electrode; forming entirely the second light guiding layer above the repair microLED, the common electrode in the original area and the first light guiding layer; and etching the second light guiding layer to expose the common electrode and a second electrode of the repair microLED, and forming the top electrode above the second light guiding layer to electrically connect the common electrode and the second electrode of the repair microLED.

According to a repair method of a bottom emission micro light-emitting diode (microLED) display of another embodiment, a transparent substrate is provided. A selection electrode is formed above the transparent substrate. A first insulating layer is formed above the transparent substrate and the selection electrode. A through hole is formed in the first insulating layer. A conductive layer and a common electrode are formed above the first insulating layer, the conductive layer filling the through hole and thus electrically connecting with the selection electrode. A flip-chip type original microLED is disposed above the conductive layer and the common electrode such that a first electrode of the original microLED bonds and electrically connects with the conductive layer, and a second electrode of the original microLED bonds and electrically connects with the common electrode. When the original microLED fails a functional test, a repair microLED is disposed above the conductive layer and the common electrode, such that a first electrode of the repair microLED bonds and electrically connects with the conductive layer and a second electrode of the repair microLED bonds and electrically connects with the common electrode. The functional test and disposing a repair microLED are repeated until passing the functional test. A light guiding layer is formed above the first insulating layer, the conductive layer, the common electrode, the original microLED and the repair microLED. A reflecting layer is formed above the light guiding layer.

DETAILED DESCRIPTION OF THE INVENTION

Figure 1:
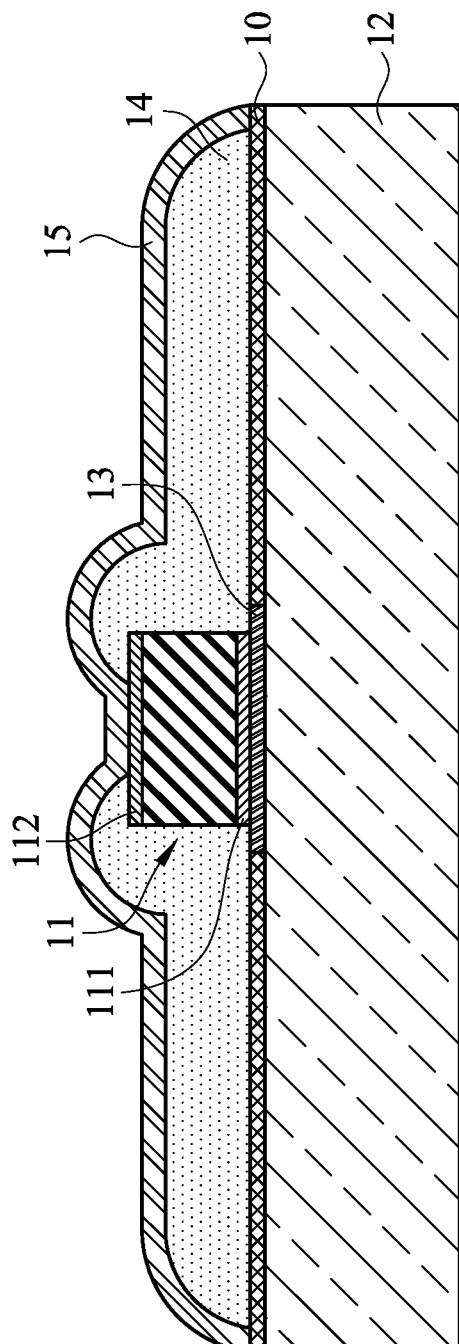
FIG. 1 shows a cross-sectional view illustrating a bottom emission microLED display according to a first embodiment of the present invention.

FIG. 1 shows a cross-sectional view illustrating a bottom emission micro light-emitting diode (microLED) display 100 according to a first embodiment of the present invention. For better understanding the embodiment, only one microLED 11 or a pixel light-emitting area is shown. In the specification, the microLED 11 has a size of 1-10 micrometers, which may be decreased or increased for specific applications or according to future technology development.

The bottom emission microLED display 100 ("microLED display" hereinafter) may include a transparent substrate 12, which may, for example, be made of glass or other non-conductive transparent material. An insulating layer 10 may be formed entirely above the transparent substrate 12. The insulating layer 10 may be an inter-layer dielectric (ILD) layer, which may include electrically insulating material such as silicon oxide or silicon nitride. A portion of the insulating layer 10 may be etched to expose the transparent substrate 12. A selection electrode 13, which may include electrically conductive material such as metal, may be formed on the exposed transparent substrate 12. As shown in FIG. 1, the microLED 11 is a vertical-type microLED with a first electrode 111 and a second electrode 112 that are disposed at bottom and top of the microLED 11, respectively. Specifically, the first electrode 111 bonds and electrically connects with the selection electrode 13. The microLED display 100 may include a light guiding layer 14 that covers the transparent substrate 12 and the microLED 11, thus surrounding the microLED 11 to controllably guide light generated by the microLED 11 towards the transparent substrate 12 such that the generated light may be emitted downwards and be vertical to a top surface of the transparent substrate 12. In the embodiment, the light guiding layer 14 may be an over-coating (OC) layer, which may include transparent material with high refractive index (e.g., higher than 1.4) such as polymer (e.g., polycarbonate (PC) or PolyMethyl MethAcrylate (PMMA)). The microLED display 100 may include a common electrode 15 covering the light guiding layer 14 and electrically connecting with the second electrode 112 of the microLED 11. The common electrode 15 of the microLED display 100 as shown in FIG. 1 may also act as a reflecting layer to reflect the light generated by the microLED 11 downwards and to confine the light generated by the microLED 11 to prevent the light from leaking upwards or sidewards. The common electrode 15 may include conductive material such as metal (e.g., aluminum, molybdenum, copper, titanium or tungsten).

Figure 2:
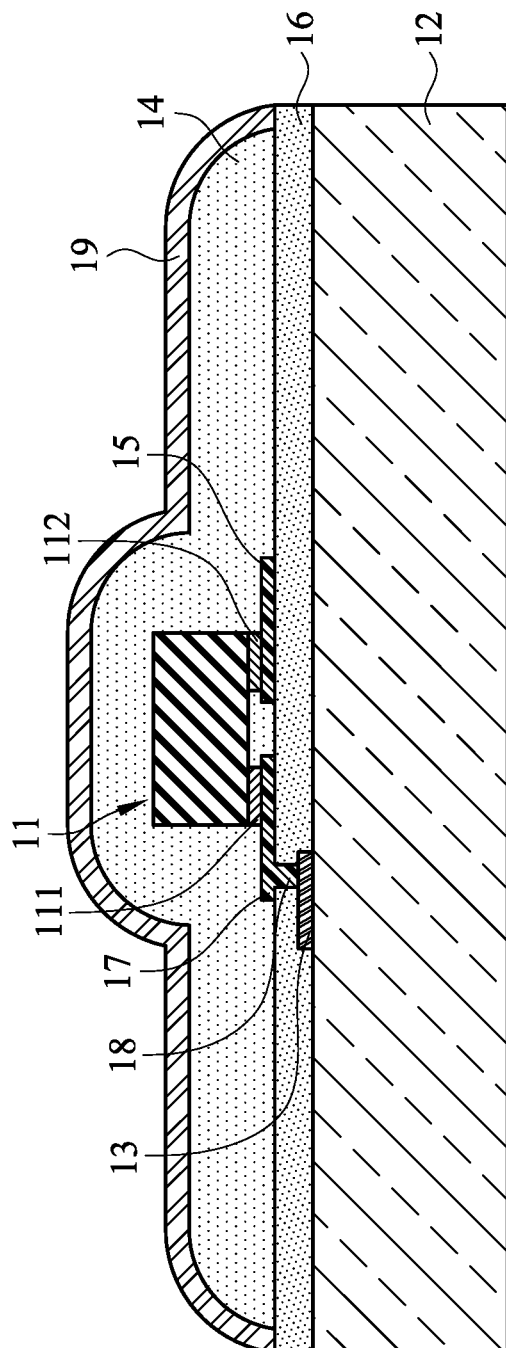
FIG. 2 shows a cross-sectional view illustrating a bottom emission microLED display according to a second embodiment of the present invention.

FIG. 2 shows a cross-sectional view illustrating a bottom emission microLED display 200 according to a second embodiment of the present invention. Same numerals are used to denote elements that are the same as FIG. 1.

The bottom emission microLED display 200 ("microLED display" hereinafter) may include a transparent substrate 12 with a selection electrode 13 formed thereon. The microLED display 200 may include an insulating layer 16 covering the transparent substrate 12 and the selection electrode 13. In the embodiment, the insulating layer 16 may be an inter-layer dielectric (ILD) layer, which may include electrically insulating material such as silicon oxide or silicon nitride. A common electrode 15 and a conductive layer 17 (including conductive material such as metal) may be formed above the insulating layer 16. As shown in FIG. 2, the microLED 11 is a flip-chip type microLED with a first electrode 111 and a second electrode 112 disposed at bottom of the microLED 11. Specifically, the first electrode 111 bonds and electrically connects with the conductive layer 17, which further electrically connects with the selection electrode 13; and the second electrode 112 bonds and electrically connects with the common electrode 15. The microLED display 200 may include a light guiding layer 14 that covers the insulating layer 16 and the microLED 11, thus surrounding the microLED 11 to controllably guide light generated by the microLED 11 towards the transparent substrate 12 such that the generated light may be emitted downwards and be vertical to a top surface of the transparent substrate 12. The microLED display 200 may include a reflecting layer 19 covering the light guiding layer 14 to reflect the light generated by the microLED 11 downwards and to confine the light generated by the microLED 11 to prevent the light from leaking upwards or sidewards. The reflecting layer 19 may include conductive material such as metal (e.g., aluminum, molybdenum, copper, titanium or tungsten).

According to aspects of FIG. 1 and FIG. 2, the microLED display 100/200 of the embodiment may include the transparent substrate 12 with the microLED 11 disposed thereabove. The light guiding layer 14 surrounds the microLED 11 to controllably guide light generated by the microLED 11 towards the transparent substrate 12. The reflecting layer 19 covers the light guiding layer 14 to reflect the light generated by the microLED 11 downwards and to confine the light generated by the microLED 11 to prevent the light from leaking upwards and sidewards. The selection electrode 13 is disposed on the transparent substrate 12 and electrically connects with the first electrode 111 of the microLED 11. For the vertical-type microLED 11 (FIG. 1), the reflecting layer acts as the common electrode 15 and electrically connects with the second electrode 112 of the microLED 11. For the flip-chip type microLED 11 (FIG. 2), the common electrode 15 is disposed between the microLED 11 and the transparent substrate 12, and electrically connects with the second electrode 112 of the microLED 11.

FIG. 3A to FIG. 3J show cross-sectional views illustrating a repair method of a (bottom emission) microLED display 300 according to a third embodiment of the present invention. The embodiment is adaptable to a vertical-type microLED. Same numerals are used to denote elements that are the same as FIG. 1.

Figure 3A:
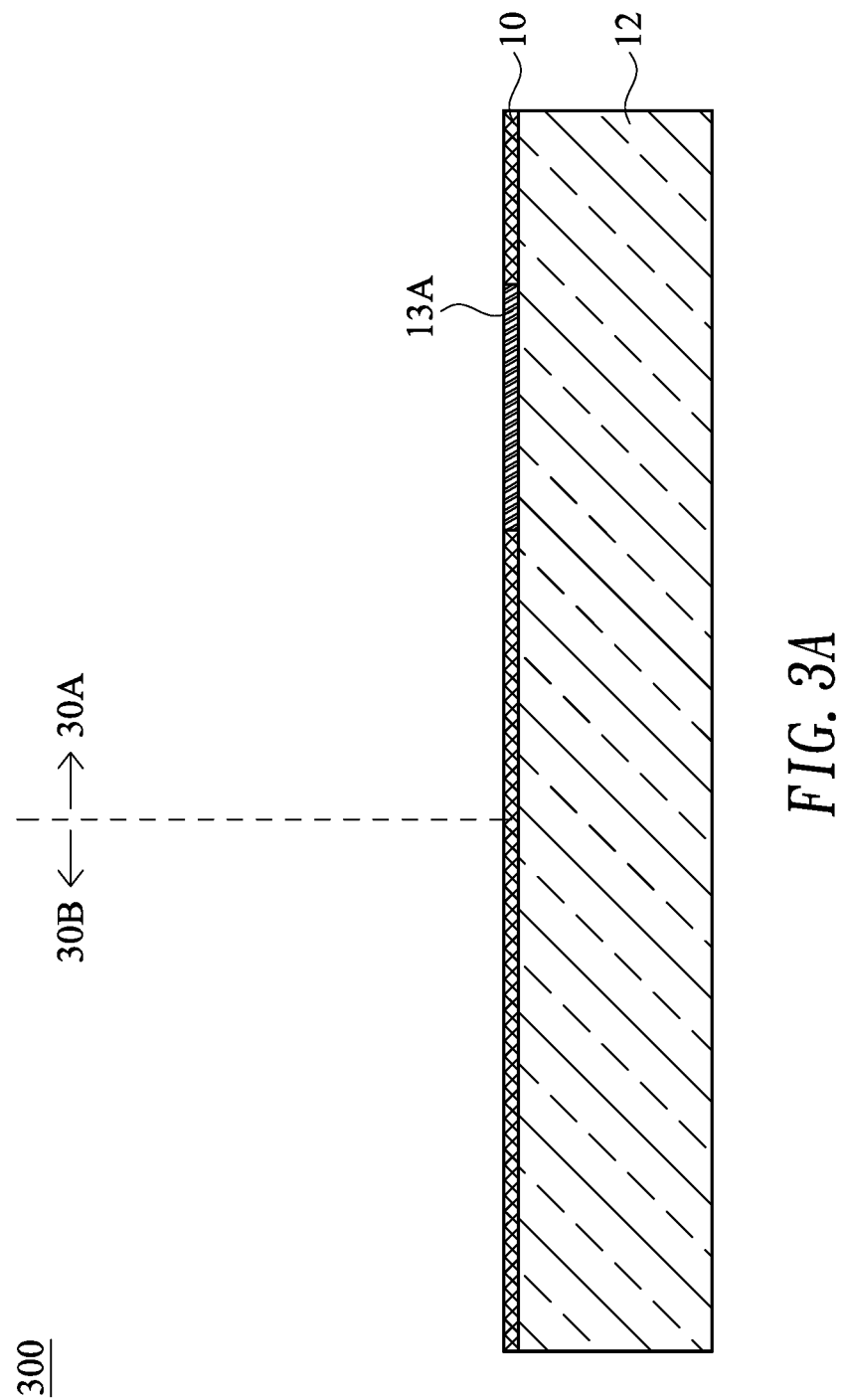
FIG. 3A to FIG. 3J show cross-sectional views illustrating a repair method of a bottom emission microLED display according to a third embodiment of the present invention.
Figure 3B:
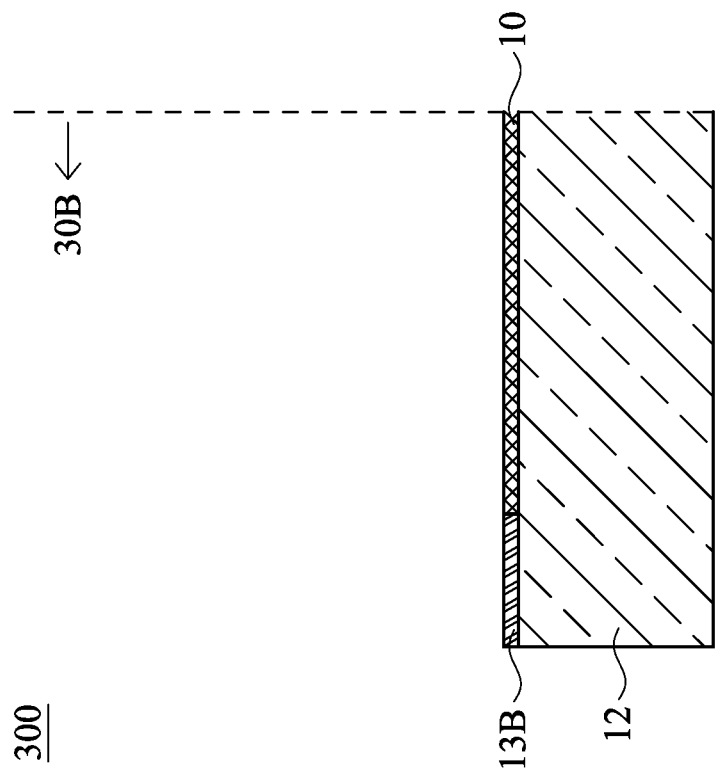

As shown in FIG. 3A, a transparent substrate 12 with an original area 30A and a repair area 30B is provided. Only one repair area 30B of a pixel light-emitting area is shown for brevity. Specifically, the original area 30A is used for disposing an original microLED and the repair area 30B is used for disposing a repair microLED. An insulating layer 10 is formed entirely above the transparent substrate 12. The insulating layer 10 may be an inter-layer dielectric (ILD) layer, which may include electrically insulating material such as silicon oxide or silicon nitride. A portion of the insulating layer 10 is etched to expose the transparent substrate 12. Next, a first conductive layer (e.g., first metal layer) is formed on the exposed transparent substrate 12, thereby resulting in a selection electrode 13A in the original area 30A of the transparent substrate 12 as shown in FIG. 3A, which a cross-sectional view along a cross line 3A-3A' of FIG. 4. An extended electrode 13B is extended from the selection electrode 13A towards the repair area 30B. The extended electrode 13B is shown in FIG. 3B, which is a cross-sectional view along a cross line 3B-3B'.

Figure 3C:
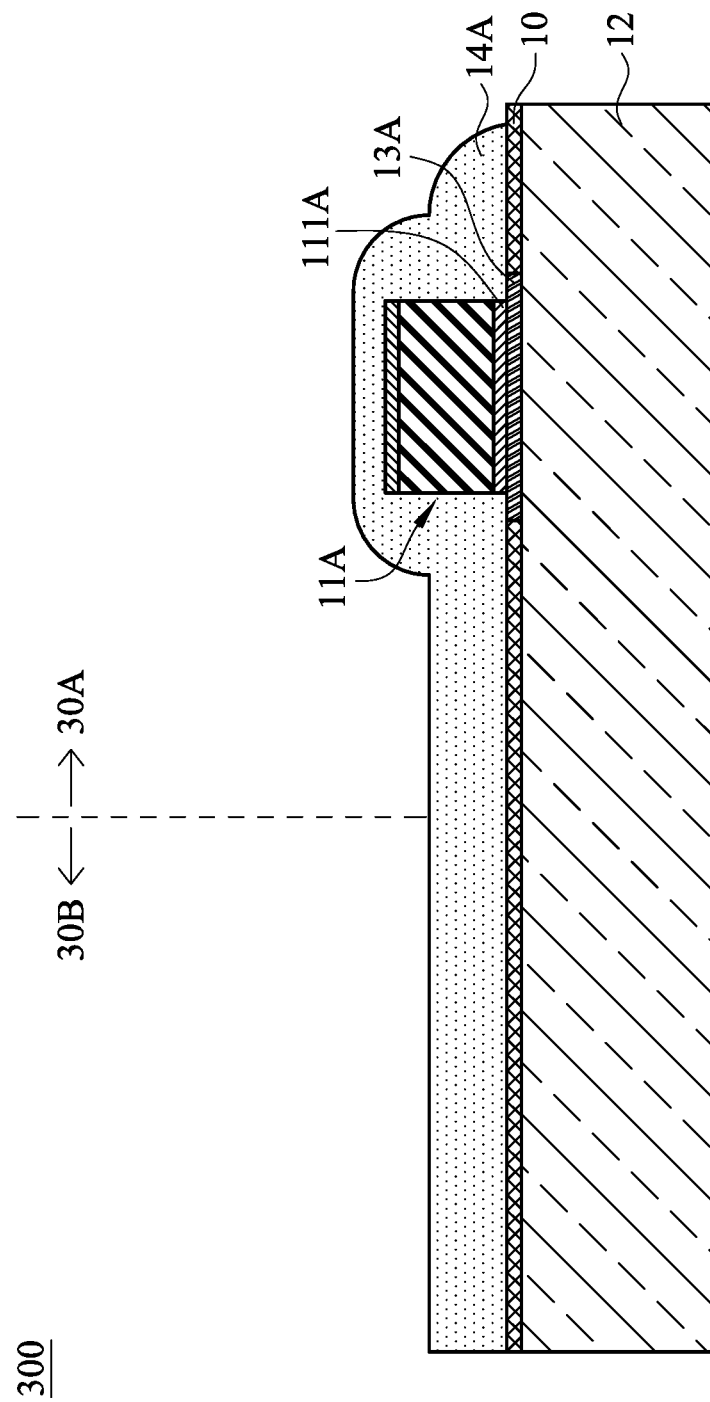
Figure 4:
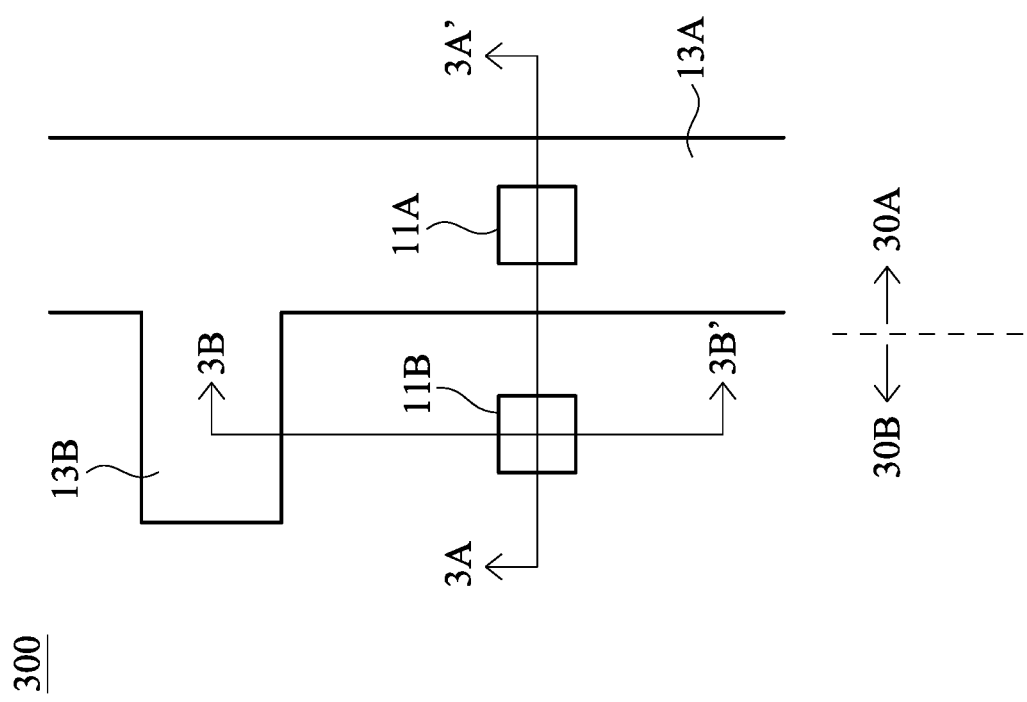
FIG. 4 shows a partial top view illustrating the microLED display of FIG. 3A to FIG. 3J.

The following descriptions refer to cross-sectional views along the cross line 3A-3A' of FIG. 4 unless otherwise noted. Referring to FIG. 3C, an original microLED 11A is disposed above the selection electrode 13A in the original area 30A such that a first electrode 111A of the original microLED 11A bonds and electrically connects with the selection electrode 13A. Next, a first light guiding layer 14A is formed to entirely cover the transparent substrate 12, the selection electrode 13A, the extended electrode 13B and the original microLED 11A to controllably guide light generated by the original microLED 11A towards the transparent substrate 12 such that the generated light may be emitted downwards and be vertical to a top surface of the transparent substrate 12. In the embodiment, the first light guiding layer 14A may be an over-coating (OC) layer, which may include transparent material with high refractive index (e.g., higher than 1.4) such as polymer (e.g., polycarbonate (PC) or PolyMethyl MethAcrylate (PMMA)).

Figure 3D:
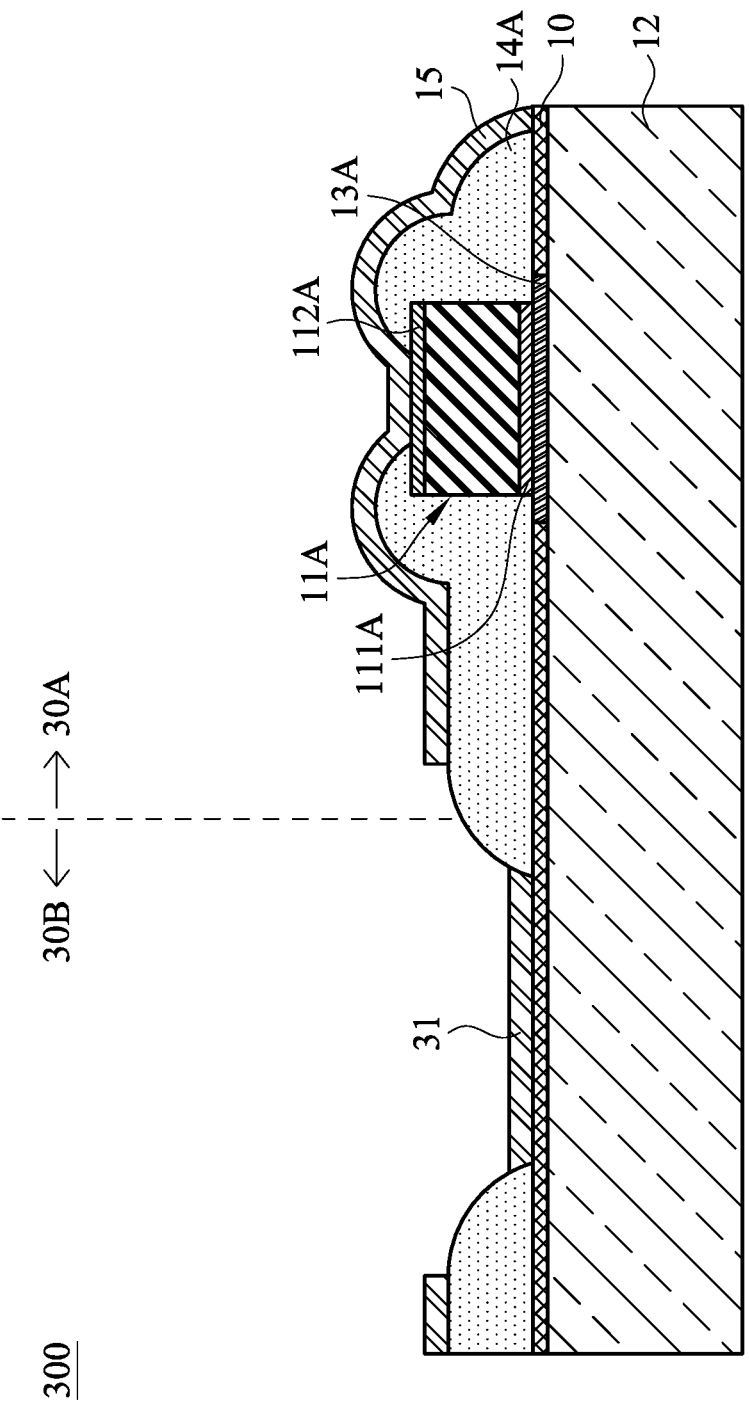
Figure 3E:
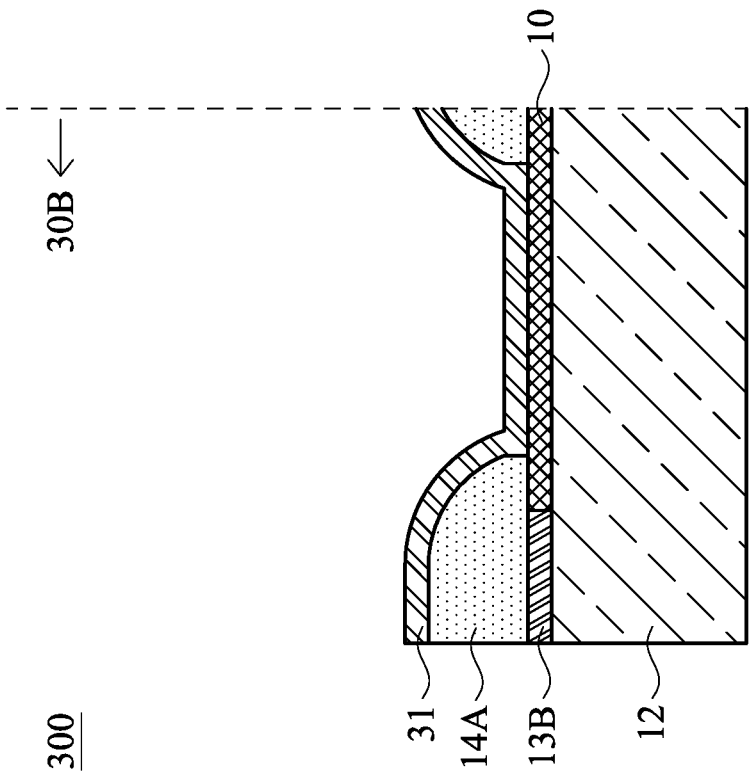

As shown in FIG. 3D, the first light guiding layer 14A is etched to expose a second electrode 112A of the original microLED 11A in the original area 30A and expose the transparent substrate 12 in the repair area 30B. Next, a second conductive layer (e.g., second metal layer) is formed, thus resulting in a common electrode 15 above the first light guiding layer 14A in the original area 30A such that the common electrode 15 electrically connects with the second electrode 112A of the original microLED 11A. Moreover, a second conductive layer 31 is also formed above the transparent substrate 12 in the repair area 30B. The common electrode 15 in the original area 30A does not electrically connect with the second conductive layer 31 in the repair area 30B. FIG. 3E shows a cross-sectional view along a cross line 3B-3B' of FIG. 4, where the extended electrode 13B (in the repair area 30B) and the second conductive layer 31 disposed thereabove partially overlap. Further, the exposed transparent substrate 12 (in the repair area 30B) is adjacent to the extended electrode 13B.

After the structure of FIG. 3D/FIG. 3E is formed, the original microLED 11A is subjected to functional test. If the original microLED 11A passes the test, the process of FIG. 3F to FIG. 3G is performed; otherwise the process of FIG. 3H to FIG. 3J is performed.

Figure 3F:
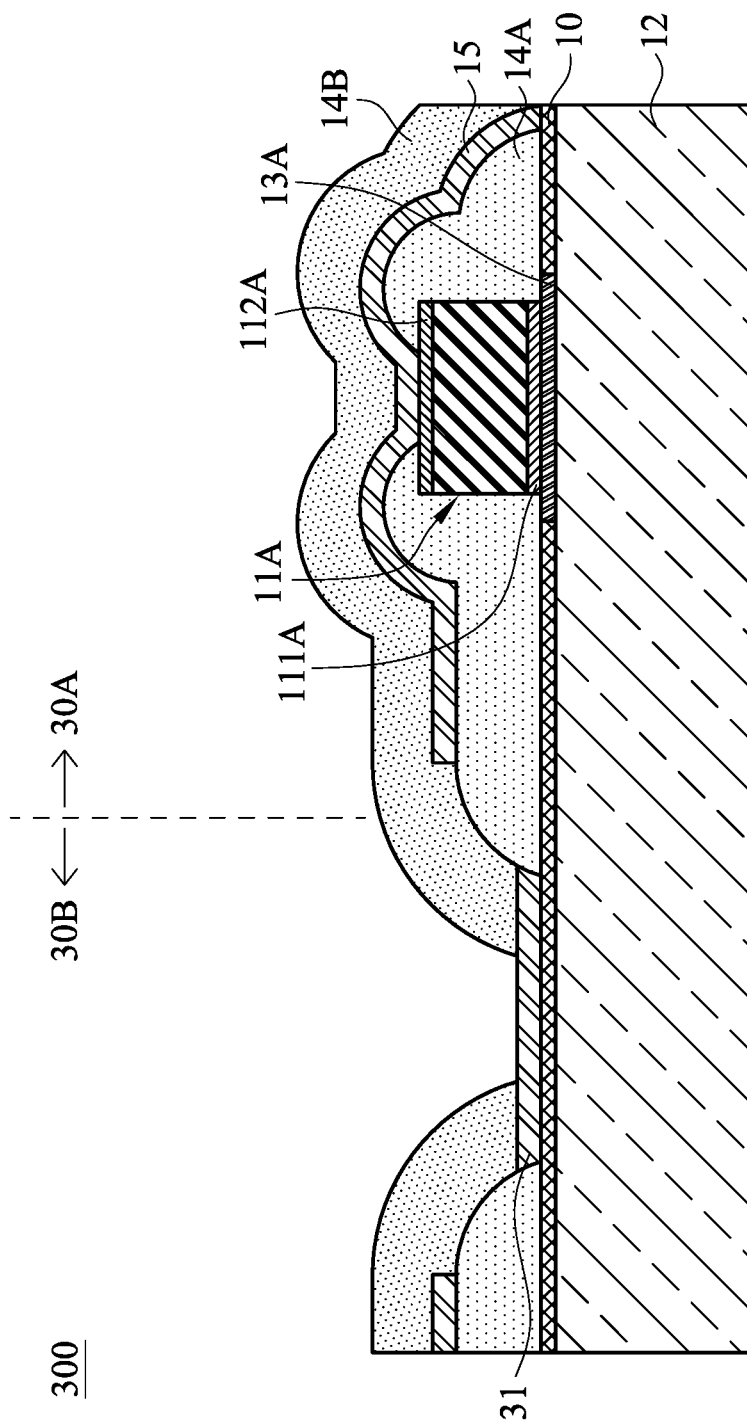

As shown in FIG. 3F, if the original microLED 11A passes the functional test, a second light guiding layer 14B is entirely formed to cover the common electrode 15 and the first light guiding layer 14A. The second light guiding layer 14B in the repair area 30B is etched to expose the second conductive layer 31. In the embodiment, the second light guiding layer 14B may be an over-coating (OC) layer, which may include transparent material with high refractive index (e.g., higher than 1.4) such as polymer (e.g., polycarbonate (PC) or PolyMethyl MethAcrylate (PMMA)). The second light guiding layer 14B may be made of material being the same as or different from the first light guiding layer 14A.

Figure 3G:
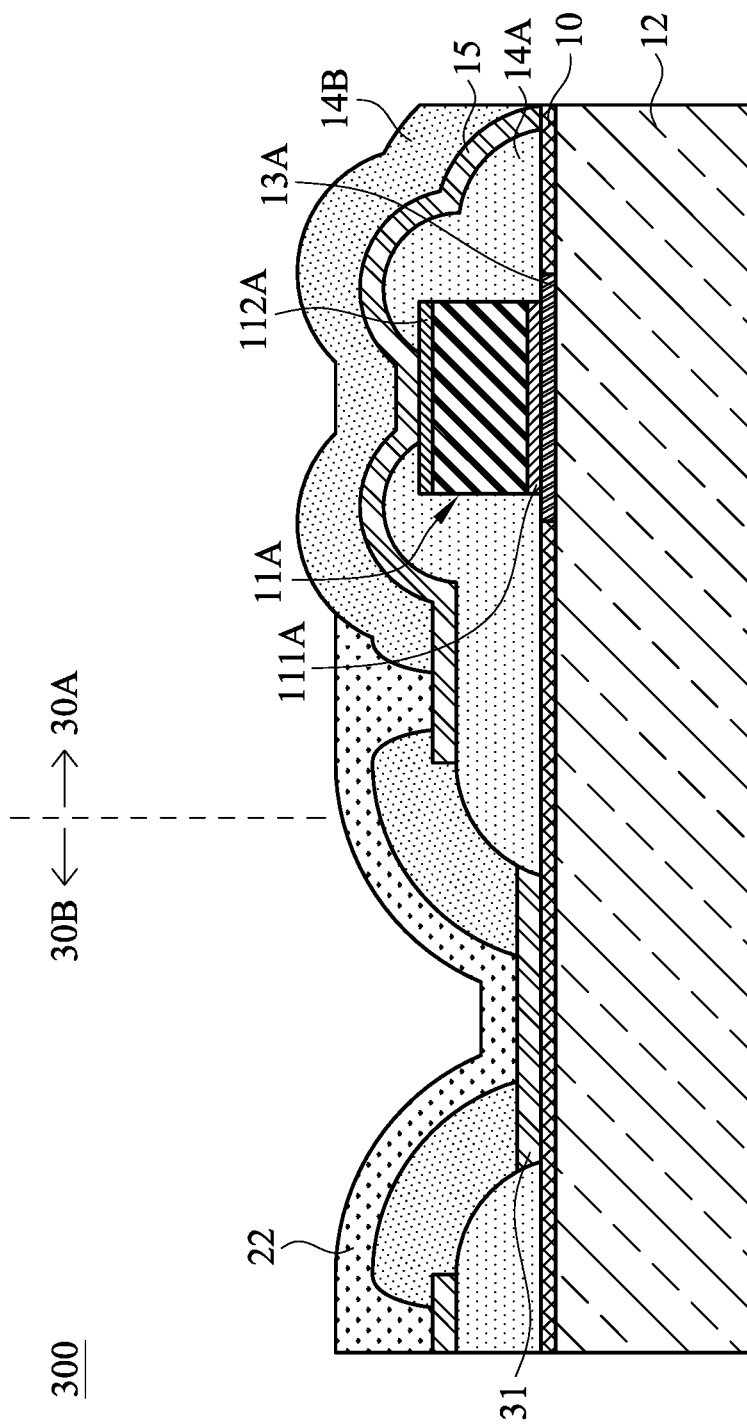

As shown in FIG. 3G, the second light guiding layer 14B is etched to expose the common electrode 15 in the original area 30A. Next, a top electrode 22 is formed above the second light guiding layer 14B to electrically connect with the common electrode 15 in the original area 30A. In the embodiment, the top electrode 22 may be a third metal layer. The top electrode 22 may be made of material being the same as or different from the common electrode 15. Accordingly, the common electrode 15 and the top electrode 22 act to reflect the light generated by the original microLED 11A downwards and to confine the light generated by the original microLED 11A to prevent the light from leaking upwards or sidewards.

Figure 3H:
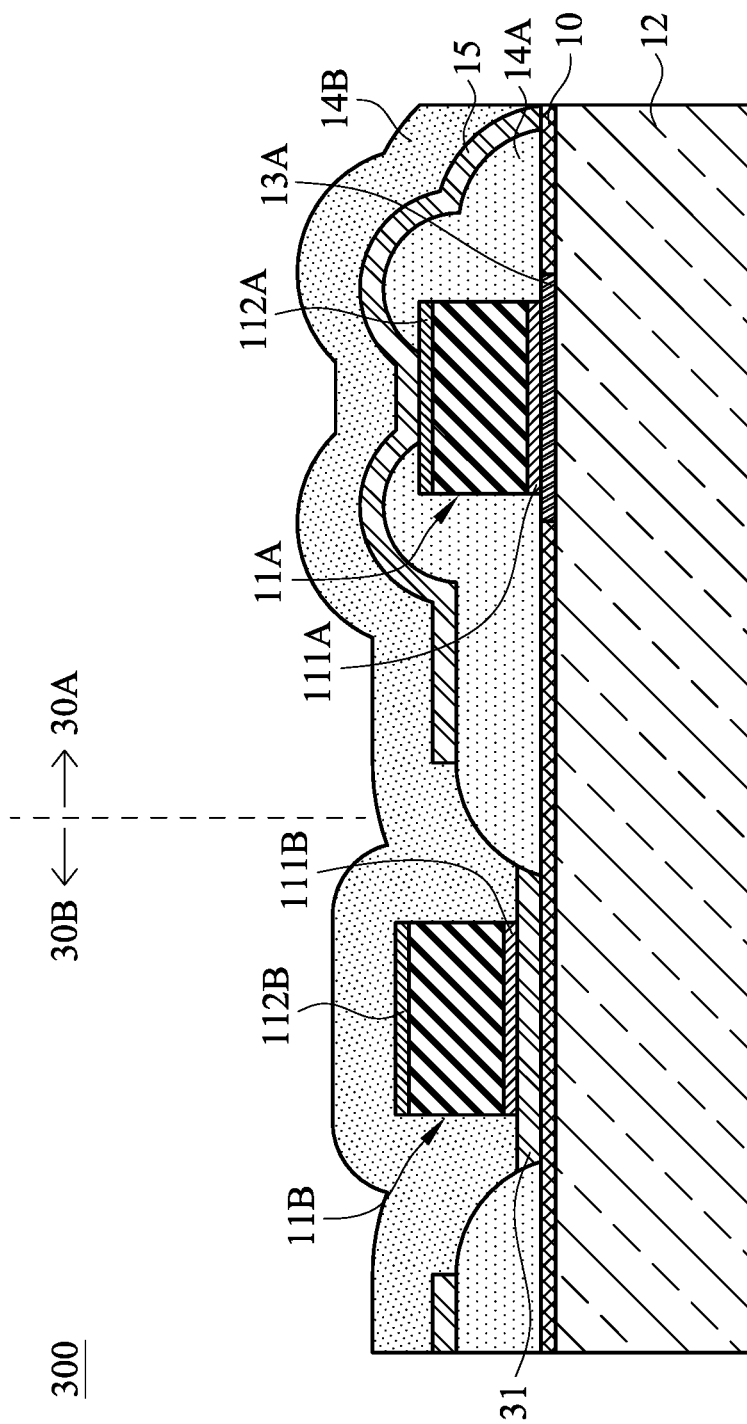
Figure 3I:
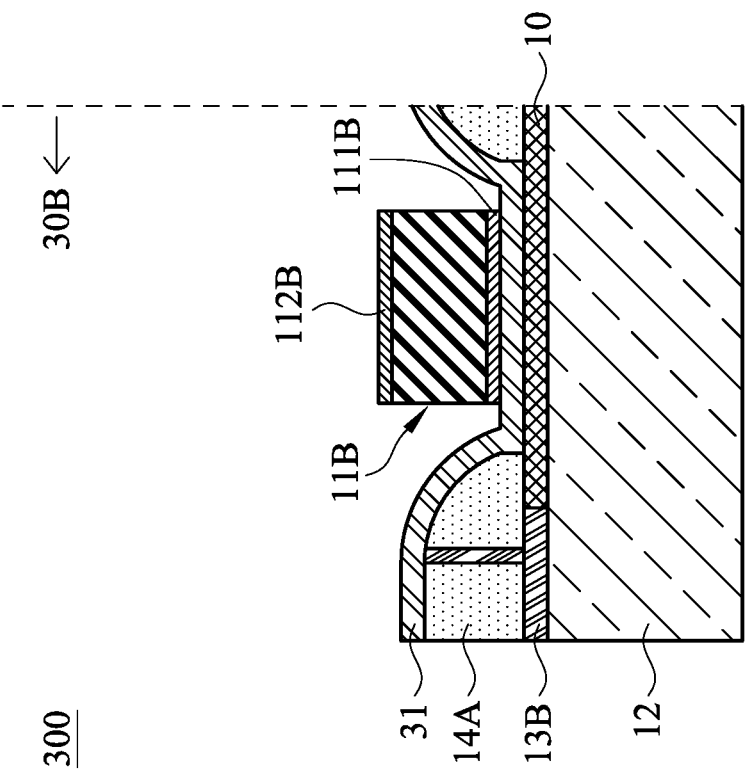
Figure 3J:
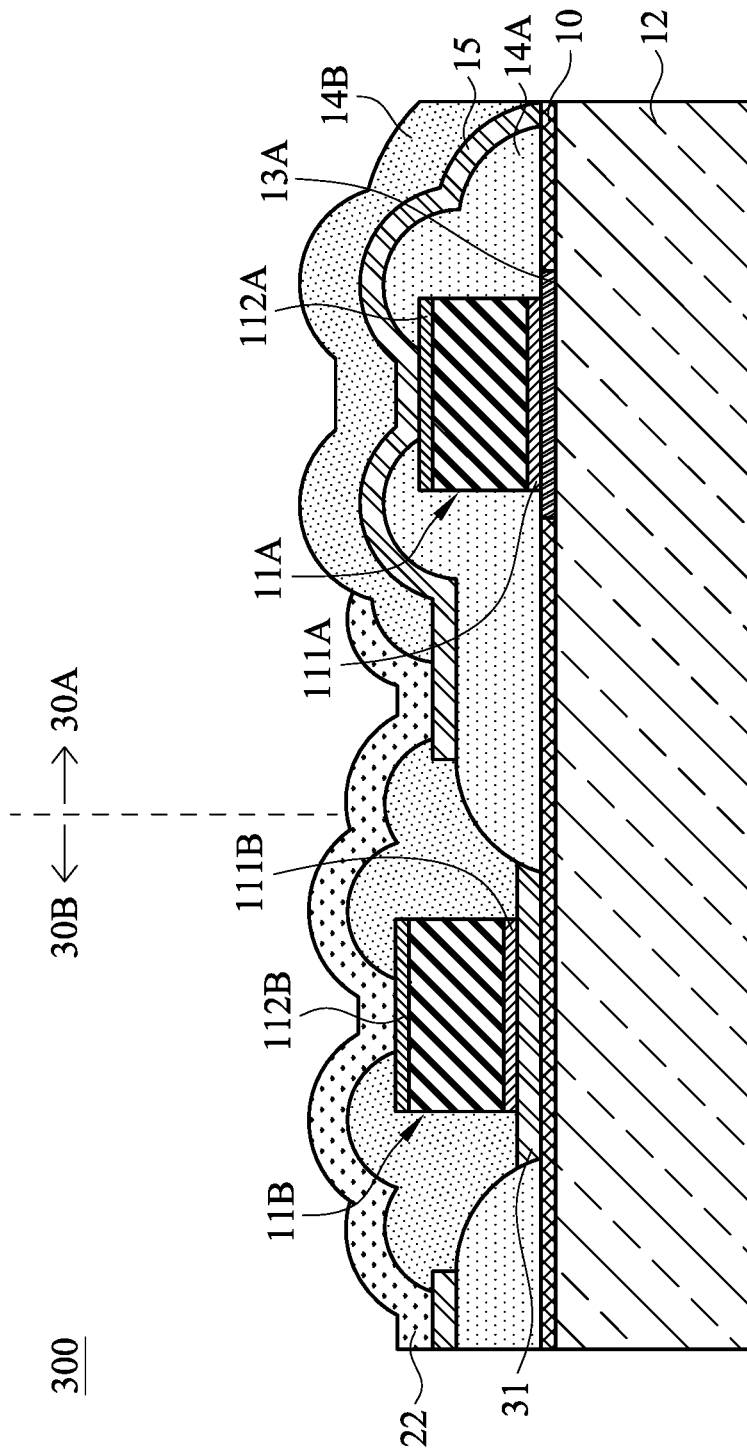

As shown in FIG. 3H, if the original microLED 11A fails the functional test, a repair microLED 11B is then disposed on the second conductive layer 31 above the exposed transparent substrate 12 (in the repair area 30B) such that a first electrode 111B of the repair microLED 11B bonds and electrically connects with the second conductive layer 31. The first electrode 111B and the second electrode 112B of the repair microLED 11B are disposed at bottom and top of the repair microLED 11B, respectively. Further, as shown in FIG. 3I, which shows a cross-sectional view along a cross line 3B-3B' of FIG. 4, the overlapped second conductive layer 31 and the extended electrode 13B (in the repair area 30B) are welded to be electrically connected by using, for example, laser welding technique. Accordingly, the first electrode 111B of the repair microLED 11B electrically connects with the selection electrode 13A via the second conductive layer 31 and the extended electrode 13B. Next, a second light guiding layer 14B is entirely formed (FIG. 3H) to cover the repair microLED 11B and the common electrode 15 and the first light guiding layer 14A in the original area 30A in order to controllably guide light generated by the repair microLED 11B towards the transparent substrate 12 such that the generated light may be emitted downwards and be vertical to a top surface of the transparent substrate 12.

As shown in FIG. 3J, which is similar to FIG. 3G, the second light guiding layer 14B is etched to expose the common electrode 15 in the original area 30A and the second electrode 112B of the repair microLED 11B. Next, a top electrode 22 is formed above the second light guiding layer 14B to electrically connect with the common electrode 15 in the original area 30A and the second electrode 112B of the repair microLED 11B. Accordingly, the top electrode 22 electrically connects with the common electrode 15 in the original area 30A. Therefore, the top electrode 22 equivalently acts as a common electrode for the repair microLED 11B. The common electrode 15 and the top electrode 22 act to reflect the light generated by the repair microLED 11B downwards and to confine the light generated by the repair microLED 11B to prevent the light from leaking upwards or sidewards.

FIG. 5A to FIG. 5F show cross-sectional views illustrating a repair method of a (bottom emission) microLED display 400 according to a fourth embodiment of the present invention. The embodiment is adaptable to a flip-chip type microLED. Same numerals are used to denote elements that are the same as the microLED display 200 of FIG. 2 or the microLED display 300 of FIG. 3A to FIG. 3J.

Figure 5A:
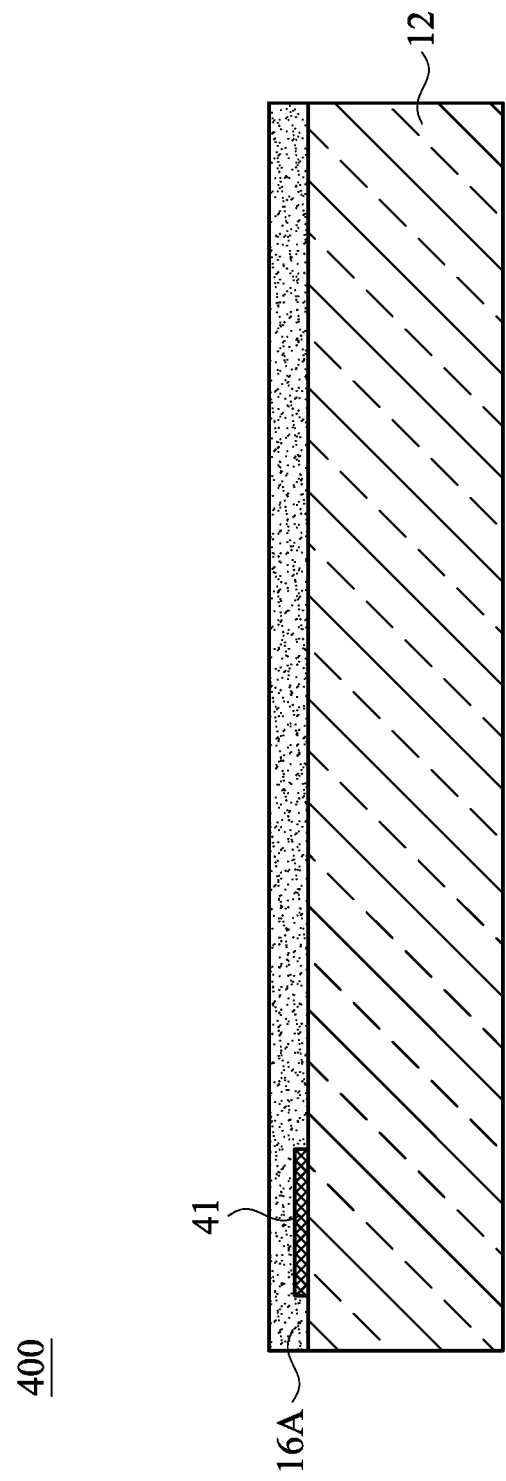
FIG. 5A to FIG. 5F show cross-sectional views illustrating a repair method of a bottom emission microLED display according to a fourth embodiment of the present invention.

As shown in FIG. 5A, a transparent substrate 12 is provided, and a bottom conductive layer 41 is formed on a top surface of the transparent substrate 12. The bottom conductive layer 41 may include conductive material such as metal. Next, a second insulating layer 16A is formed above the bottom conductive layer 41 and the transparent substrate 12. In the embodiment, the second insulating layer 16A may be an inter-layer dielectric (ILD) layer, which may include electrically insulating material such as silicon oxide or silicon nitride.

Figure 5B:
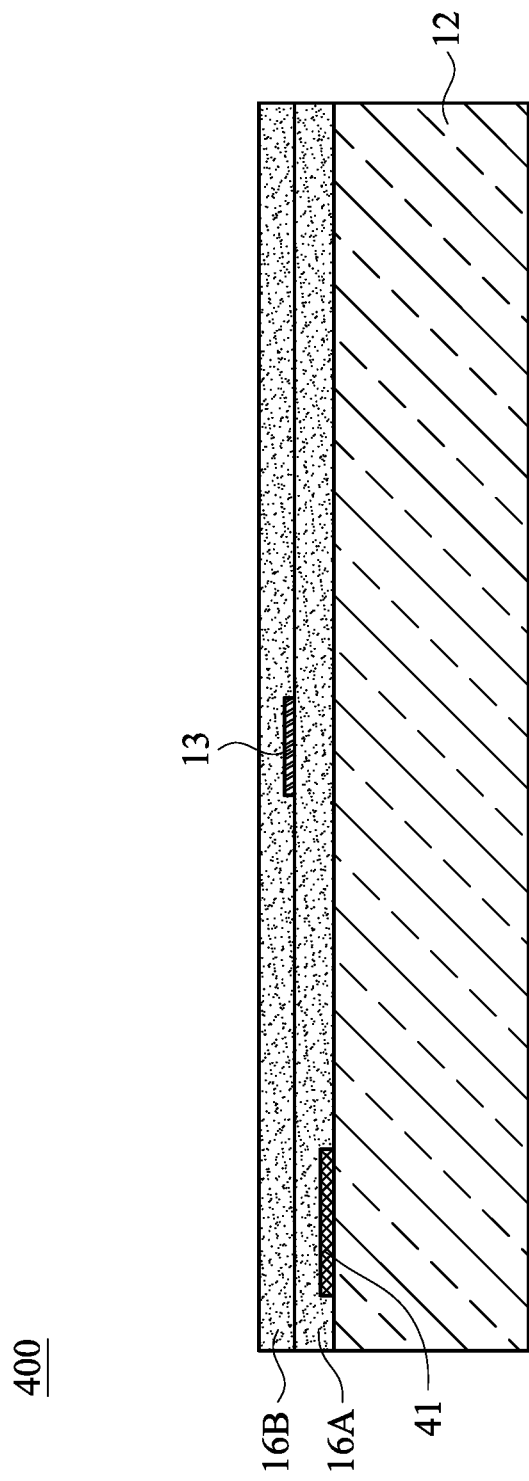

As shown in FIG. 5B, a selection electrode 13 is formed above the second insulating layer 16A. In the embodiment, the selection electrode 13 may be a first metal layer. Next, a first insulating layer 16B is formed above the second insulating layer 16A and the selection electrode 13. In the embodiment, the first insulating layer 16B may be an inter-layer dielectric (ILD) layer, which may include electrically insulating material such as silicon oxide or silicon nitride.

Figure 5C:
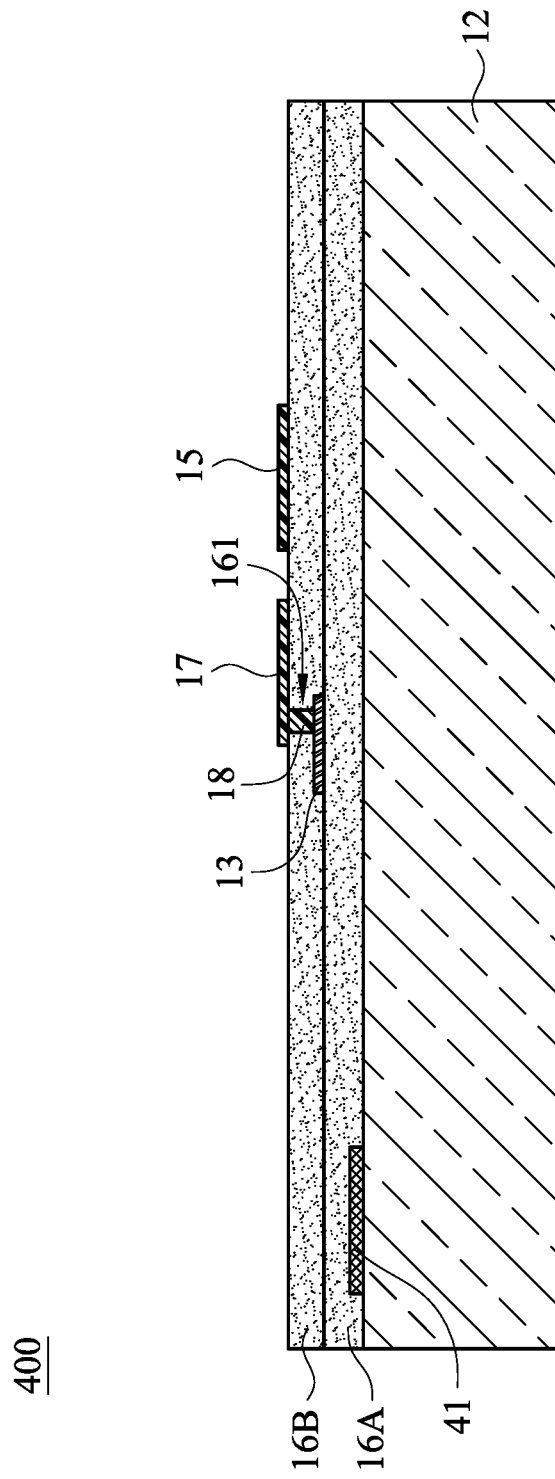

As shown in FIG. 5C, a through hole 161 is formed in the first insulating layer 16B. Next, a conductive layer 17 and a common electrode 15 are formed on a top surface of the first insulating layer 16B, where the conductive layer 17 fills the through hole 161 and thus electrically connects with the selection electrode 13. In the embodiment, the conductive layer 17 and the common electrode 15 may be a second metal layer.

Figure 5D:
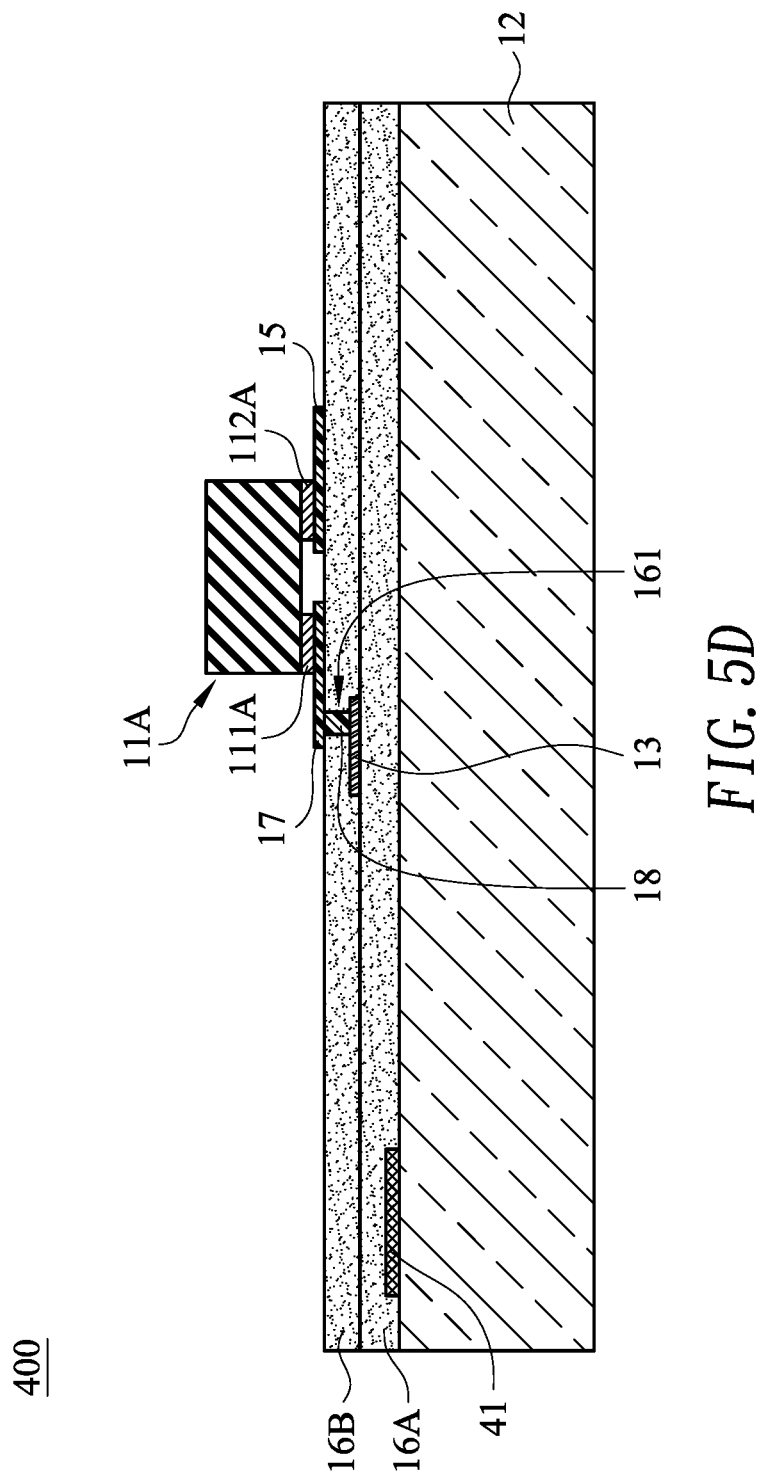

As shown in FIG. 5D, an original microLED 11A is disposed above the conductive layer 17 and the common electrode 15 such that a first electrode 111A of the original microLED 11A bonds and electrically connects with the conductive layer 17, and a second electrode 112A bonds and electrically connects with the common electrode 15.

After the structure of FIG. 5D is formed, the original microLED 11A is subjected to functional test. If the original microLED 11A passes the test, the process of FIG. 5F is performed; otherwise the process of FIG. 5E to FIG. 5F is performed.

Figure 5E:
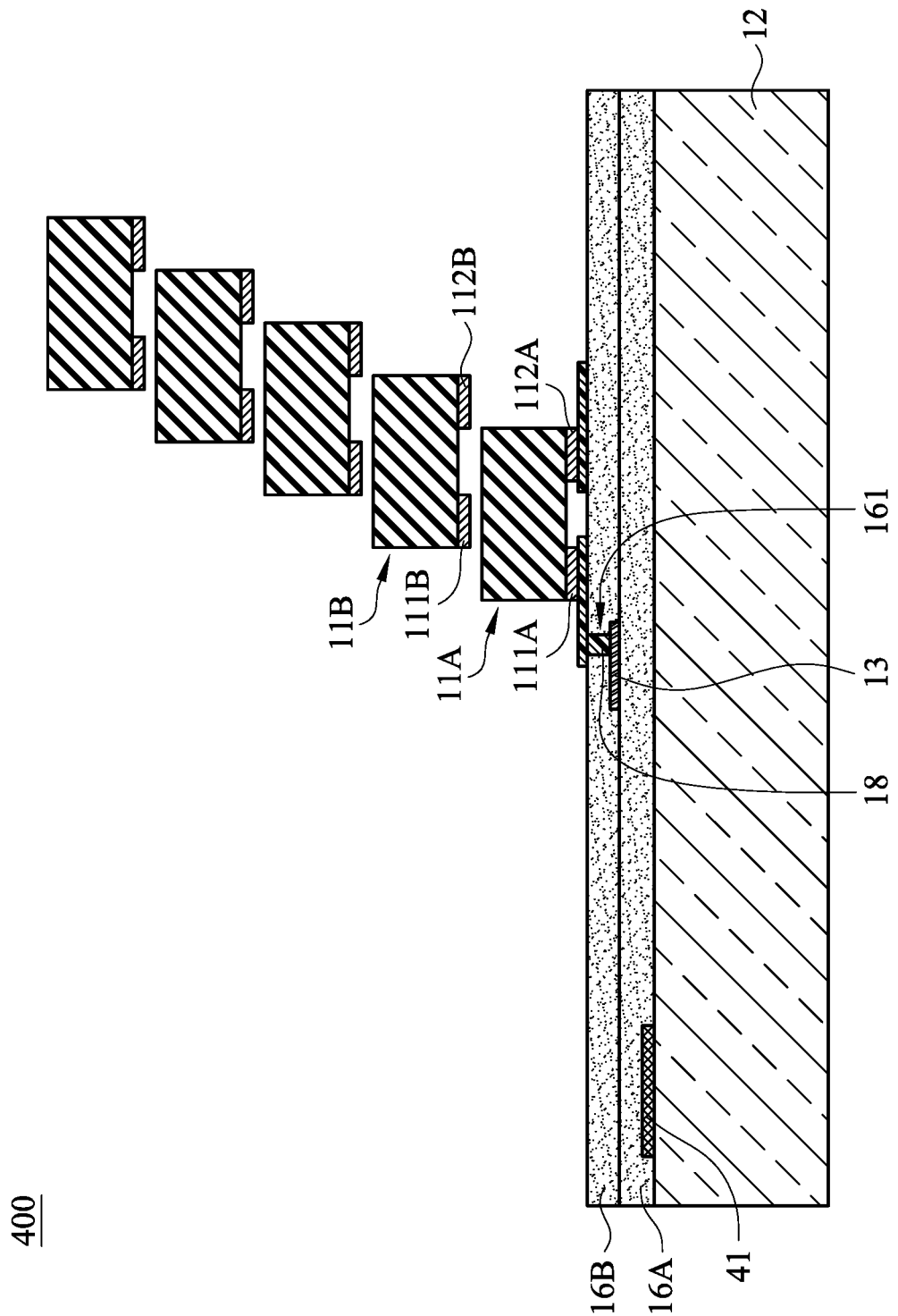

As shown in FIG. 5E, if the original microLED 11A fails the functional test, a repair microLED 11B is then disposed above the conductive layer 17 and the common electrode 15 such that a first electrode 111B of the repair microLED 11B bonds and electrically connects with the conductive layer 17 and a second electrode 112B bonds and electrically connects with the common electrode 15. Specifically, the repair microLED 11B and the original microLED 11A are disposed at the same level. Next, the repair microLED 11B is subjected to functional test. If the repair microLED 11B fails the functional test, another repair microLED 11B is disposed, followed by functional test. This procedure repeats until passing the functional test. FIG. 5E exemplifies disposing four repair microLEDs 11B. FIG. 6 shows a partial top view illustrating the microLED display 400 of FIG. 5A to FIG. 5F. Specifically, a bottom end (or near end) of the conductive layer 17 is near the selection electrode 13, and a top end (or far end) of the conductive layer 27 is far away from the selection electrode 13. The original microLED 11A is disposed at far ends of the conductive layer 17 and the common electrode 15. If the original microLED 11A fails the functional test, a repair microLED 11B_1 is disposed at near ends of the conductive layer 17 and the common electrode 15. Before (or after) disposing the repair microLED 11B_1, if it is found that the original microLED 11A makes shoring between the conductive layer 17 and the common electrode 15, the conductive layer 17 and/or the common electrode 15 is cut off at position 171/151, for example, by using laser cutting technique. If the repair microLED 11B_1 still fails the functional test, a repair microLED 11B_2 is disposed nearer the near ends of the conductive layer 17 and the common electrode 15. Before (or after) disposing the repair microLED 11B_2, if it is found that the repair microLED 11B_1 makes shoring between the conductive layer 17 and the common electrode 15, the conductive layer 17 and/or the common electrode 15 is cut off at position 172/152. Other repair microLEDs 11B_3 and 11B_4 follow the same repair procedure as described above.

Figure 5F:
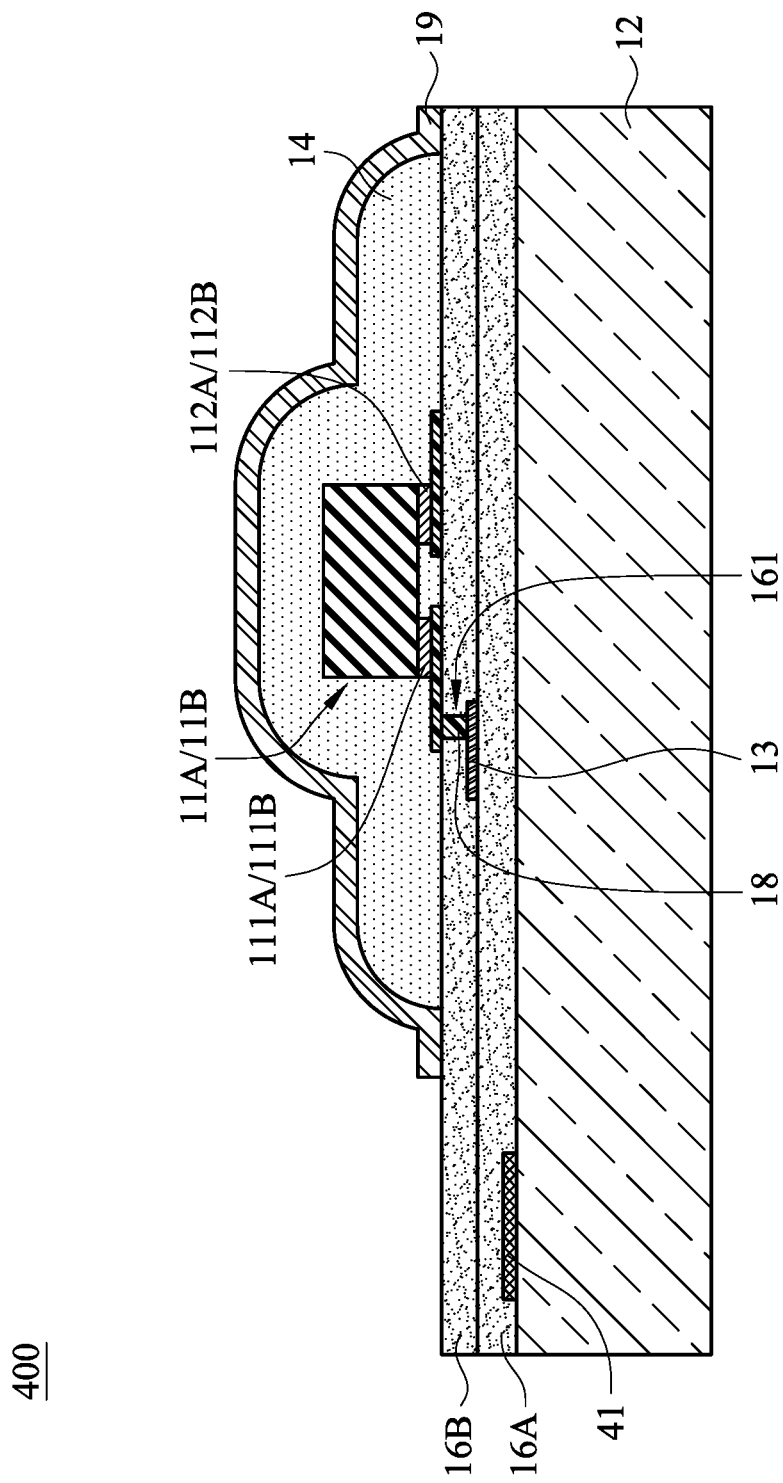
Figure 6:
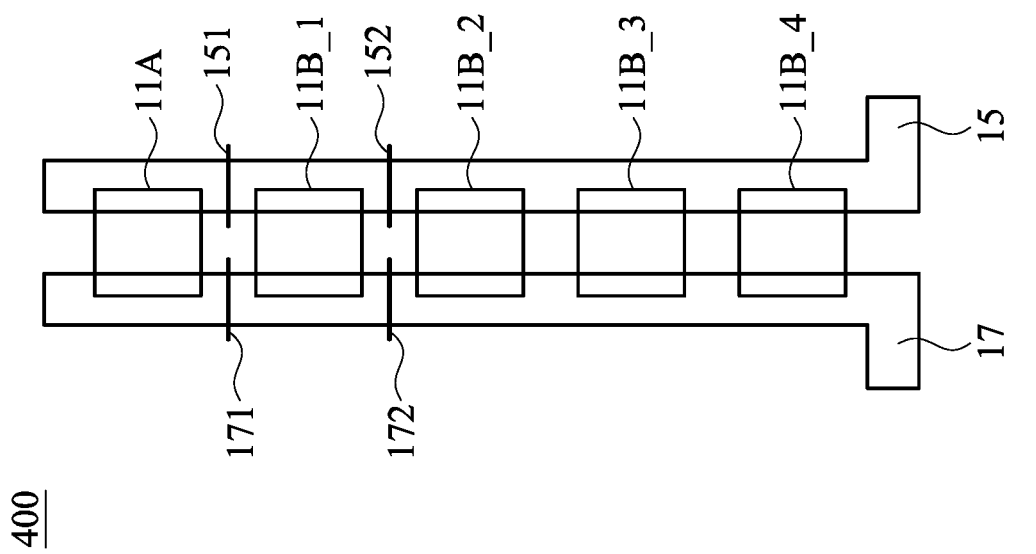
FIG. 6 shows a partial top view illustrating the microLED display of FIG. 5A to FIG. 5F.

As shown in FIG. 5F, a light guiding layer 14 is formed to cover the first insulating layer 16B, the conductive layer 17 and the common electrode 15 in the pixel light-emitting area, and cover the original microLED 11A and/or the repair microLED 11B (only one microLED is shown in FIG. 5F) in order to controllably guide light generated by the original microLED 11A and/or the repair microLED 11B towards the transparent substrate 12 such that the generated light may be emitted downwards and be vertical to a top surface of the transparent substrate 12. Next, a reflecting layer 19 is formed above the light guiding layer 14 to reflect the light generated by the original microLED 11A/repair microLED 11B downwards and to confine the light generated by the original microLED 11A/repair microLED 11B to prevent the light from leaking upwards or sidewards. In the embodiment, the reflecting layer 19 may be a third metal layer.

Compared to the vertical-type microLED display 300 of the third embodiment (FIG. 3A to FIG. 3J), the flip-chip type microLED display 400 of the fourth embodiment (FIG. 5A to FIG. 5F) provides a repair method that uses fewer layers (that is, fewer masks and process steps) and facilitates functional test and repair.

Although specific embodiments have been illustrated and described, it will be appreciated by those skilled in the art that various modifications may be made without departing from the scope of the present invention, which is intended to be limited solely by the appended claims.

What is claimed is:

1. A bottom emission micro light-emitting diode (microLED) display, comprising:
    a transparent substrate;
    a microLED disposed above the transparent substrate, the microLED being a flip-chip type microLED;
    a light guiding layer surrounding the microLED to controllably guide light generated by the microLED towards the transparent substrate;
    a reflecting layer formed over the light guiding layer to reflect the light generated by the microLED downwards and to confine the light generated by the microLED to prevent the light from leaking upwards or sidewards;
    a selection electrode disposed above the transparent substrate, and electrically connected with a first electrode of the microLED; and
    a common electrode disposed between the microLED and the transparent substrate, and electrically connected with a second electrode of the microLED.

2. The display of claim 1, further comprising:
    an insulating layer disposed above the transparent substrate and the selection electrode; and
    a conductive layer disposed above the insulating layer, the conductive layer electrically connecting with the selection electrode;
    wherein a first electrode of the microLED bonds and electrically connects with the conductive layer.

3. The display of claim 1, wherein the transparent substrate comprises glass.

4. The display of claim 1, wherein the light guiding layer comprises transparent material with diffractive index higher than 1.4.

5. The display of claim 1, wherein the light guiding layer comprises polymer.

6. The display of claim 1, wherein the reflecting layer comprises electrically conductive material.

7. The display of claim 6, wherein the reflecting layer comprises metal.

* * * * *